July 20, 1965 J. H. BOYDEN 3,196,360

LOW NOISE AMPLIFIER

Filed Dec. 14, 1960

JAMES H. BOYDEN
*INVENTOR.*

BY David P. Ogden

ATTORNEY.

United States Patent Office 3,196,360
Patented July 20, 1965

3,196,360

LOW NOISE AMPLIFIER

James H. Boyden, Altadena, Calif., assignor, by mesne assignments, to Thompson Ramo Wooldridge Inc., Cleveland, Ohio, a corporation of Ohio Filed Dec. 14, 1960, Ser. No. 75,750
11 Claims. (Cl. 330—10)

This invention relates to a low noise amplifier and more particularly to a parametric amplifier wherein a high frequency power carrier wave is modulated by a lower frequency signal information to obtain a low noise amplified signal information.

Electronic industry has for many years been plagued with the problem of noise and distortion of audio and lower radio frequencies. Numerous complex and expensive circuit designs have been developed to overcome the inherent noise characteristics of the circuit components. On the other hand, although it has been recognized that parametric amplifiers are low noise devices, many of the circuits utilizing high frequency parametric principles have been limited to high frequency signal amplification. However, low noise signal amplification of low frequencies is rapidly becoming extremely useful in present day electronic circuitry components of computers, atomic frequency standards, and the like.

Therefore, it is an object of the present invention to provide a simple and reliable low noise audio frequency amplifier arrangement.

It is a further object to provide improved parametric modulated delay lines coupled to a phase detector to obtain relatively low frequency amplification.

It is a further object of the present invention to provide improved phase modulated delay line arrangements.

The foregoing and related objects are realized in one embodiment of the present invention in the form of a low noise audio frequency amplifier system wherein a pair of parallel lumped constant delay lines are primarily energized from a high frequency power source applied at one (input) end of each of two matched impedance delay lines. Also supplied in push-pull to the pair of lumped constant delay lines is audio frequency signal information which affects phase modulation of the high frequency signal by varying the effected capacitance of the lumped capacitors of the delay lines. These lumped capacitors are of the voltage sensitive type exemplified by reverse bias semiconductor diodes. Thus the capacitors of the pair of lumped consant delay lines are capacity modulated in opposite directions in accordance with the instantaneous signal strength of the audio frequency applied thereacross, resulting in equal but opposite phase shift in the two lines. An output phase detector connected to the other (output) end of the lumped constant delay lines compares the phase relationship of the high frequency signal traversing the delay lines and provides output signal information of a frequency equal to the audio signal information at a substantially greater power level.

The subject matter which is regarded as my invention is particularly pointed out and distinctly claimed in the concluding portion of this specification. The invention, however, as to its organization and operation, together with further objects and advantages thereof, will best be understood by reference to the following description taken in connection with the accompanying drawing in which:

Figure 1:
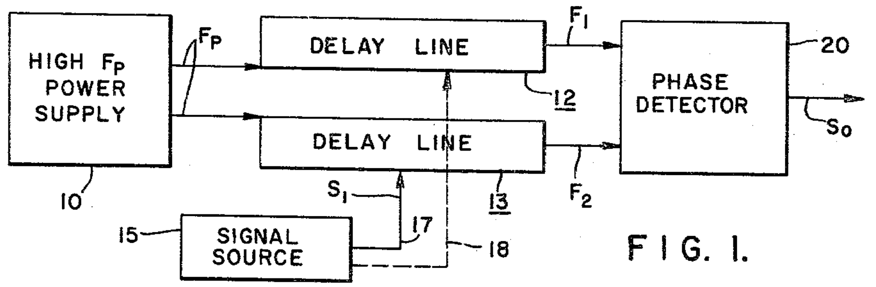
FIG. 1 is a block diagram illustrating the components of the present invention.

Referring now to the drawing, wherein like numbers refer to similar parts, there is shown in FIG. 1 a low impedance high frequency power source 10 coupled to supply a high frequency carrier wave signal $F_p$ to the input end of a pair of matched low impedance delay lines 12 and 13. Also coupled to at least one of delay lines 12 and 13 is an audio frequency signal source 15. As illustrated in FIG. 1, an audio frequency signal $S_1$ may be applied to only one delay line 13 by a coupling line 17 (solid line) or may be coupled to both delay lines 12 and 13 by coupling lines 17 and 18 (dash line).

In accordance with the present invention either (or both) of the delay lines receiving the audio signal $S_1$ is composed of voltage sensitive impedance elements whereby the audio frequency signal $S_1$ will modify the delay line transmission of the high frequency signal $F_p$. As a result, the relative transmissivity of the delay lines, because of the instantaneous magnitude of the signal $S_1$, changes the relative phase of the high frequency signal $F_p$ to that of the signals $F_1$ and $F_2$ which are received by a phase detector 20. When both delay lines 12 and 13 are similar lumped capacitance delay lines and when the audio frequency signal $S_1$ is applied to both delay lines, it is applied in push-pull (out of phase) relationship to develop a phase difference in the signals $F_1$ and $F_2$ at the output end of the delay lines. The instantaneous phase difference is a function of the instantaneous voltage of the signal $S_1$. When only one delay line (13) is modulated by the signal $S_1$, the phase output of the signal $F_2$ of the delay line 13 will be changed with respect to the unmodulated delay line 12 as a function of the instantaneous value of the signal $S_1$. The magnitude of the output signal $S_0$ from the phase detector 20 is proportional to the relative instantaneous phase shift of the high frequency signal $F_p$ emanating from the delay lines 12 and 13.

Figure 2:
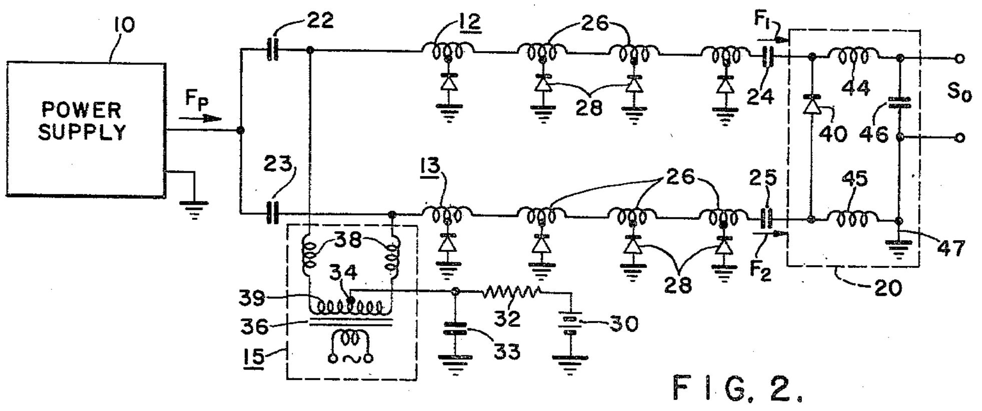
FIG. 2 is a schematic circuit diagram illustrating one embodiment of the present invention.

Referring now to FIG. 2, there is shown a schematic circuit diagram wherein the principles illustrated in FIG. 1 may be explained further in detail. The high frequency signal $F_p$ from the power source 10 passes through a pair of low impedance filter means indicated as capacitors 22 and 23. The capacitors 22 and 23 are selected to have a small capacitance so that the audio frequency signal $S_1$ is substantially isolated from the power source 10 whereby the signal $S_1$ is not dissipated in the low impedance power source 10. As an alternative, the capacitors 22 and 23 may be replaced by high frequency series LC filter networks. The use of filter networks will facilitate amplification of a signal $S_1$ having a frequency approaching that of the high frequency signal $F_p$. However, when either a low radio frequency or an audio frequency signal is coupled in circuit with a high frequency (e.g. 10 megacycles) carrier signal $F_p$, very simple isolating components may be employed. Similar high frequency filter components shown as the capacitors 24 and 25 are used to prevent direct transmission of the signal $S_1$ to the phase detector 20.

As illustrated in FIG. 2, the delay lines 12 and 13 are similar matched impedance lumped constant delay lines and the signal $S_1$ is applied in push-pull out of phase relationship to the input end of both delay lines. The delay lines illustrated consist of lumped inductors 26 and lumped capacitors 28. The lumped capacitors are, in this particular embodiment, voltage sensitive whereby the capacitance thereof varies as a function of the voltage applied thereacross. As illustrated schematically in FIG. 2, one acceptable form of voltage sensitive variable capacitor is a reverse bias semiconductor diode especially designed to have a junction capacitance dependent on the magnitude of reverse voltage applied thereto. In this type of voltage sensitive capacitor the voltage applied thereacross is believed to vary the effective spacing of the charges on the "plates" of the capacitor and thus vary its capacitance. One such diode is marketed by Pacific Semiconductors Corporation as V56.

The initial bias voltage applied to the capacitors 28 is derived from a D.C. voltage source 30 connected, by way of example, through a coupling circuit consisting of a resistor 32 and a capacitor 33 to a voltage tap 34 located electrically midway between the two delay lines 12 and 13. The audio signal source 15 illustrated in FIG. 2 includes an audio transformer 36 and a pair of decoupling RF chokes 38 such that the signal $S_1$ is applied in push-pull to the delay lines 12 and 13 without feedback of the high frequency power signal $F_p$ to the audio frequency signal source 15. As illustrated, the voltage tap 34 is placed at the center of the secondary winding 39 of the transformer 36. Although the low frequency signal $S_1$ is illustrated in FIG. 2 as being applied at the input end of the delay lines, its function is to vary the voltage across and therefore the capacitance of all of the capacitors 28. Therefore the point of application of the low frequency signal $S_1$ is not critical in many applications of the present invention.

The magnitude of the bias voltage (30) is selected so that, for the magnitude of alternating signals contemplated in the delay lines 12 and 13, the capacitors 28 will remain non-conductive. Thus, the bias voltage is also made large enough to account for voltage variations across the capacitors 28 because of both the high frequency power supplied thereto from the power source 10 and the low frequency signal $S_1$. Perhaps most important is the regulation of the bias voltage to obtain greatest feasible amplification with the conditions above mentioned, depending upon the capacitance-voltage characteristics of the capacitors 28. Often this will result in the selection of bias voltage only slightly greater than the minimum voltage which will prevent current flow through capacitors 28.

The particular circuit arrangement of the phase detector 20 is an example of a simple phase detector consisting of a single semiconductor diode rectifier arrangement 40 coupled between the capacitors 24 and 25 and an RF filter system. The particular RF filter system illustrated in FIG. 2 consists of a pair of RF chokes 44 and 45 and a capacitor 46 across which the output signal $S_0$ is developed. If a push-pull output equal $S_0$ is required, the ground connection 47 may be modified by well known circuit techniques. As is well known in the art of phase detectors, the output signal $S_0$ is obtained as a function of relative phase variation between the two signals $F_1$ and $F_2$ applied thereto.

Figure 3:
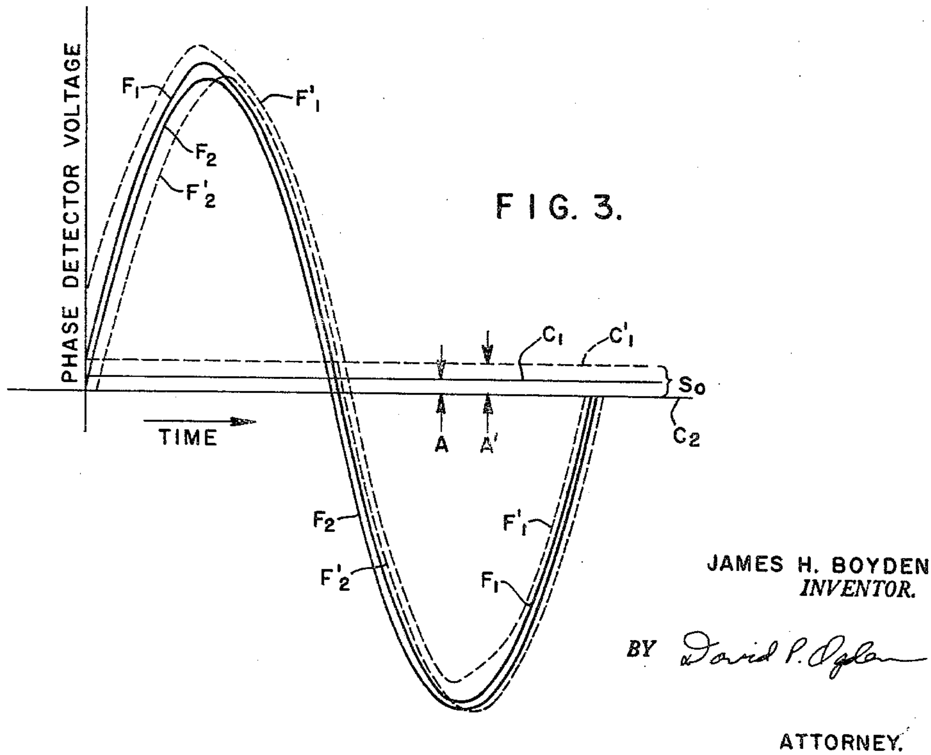
FIG. 3 is a graph useful in explaining the operation of a phase detector of the present invention.

Referring now to FIG. 3, showing simplified curves of the phase detector voltage on the scale of the ordinates with the scale of the abscissa being time duration, (the in-phase) unmodulated carrier frequency signals $F_1$ and $F_2$ are shown in solid lines having sinusoidal variation as a function of time. With the particular phase detector illustrated, the center line $C_2$ of the signal $F_2$ (solid line) is at zero because of the ground connection 47 and the center line $C_1$ of the signal $F_1$ (solid line) is at a voltage slightly above zero because of a very small current flow through the phase detector diode arrangement 40 resulting from a very slight mismatching of the matched delay lines 12 and 13. Since the signals are substantially in-phase, the rate of current flow through the diode arrangement 40 is very small, as illustrated by the voltage difference A between the center lines $C_1$ and $C_2$.

However, when the information signal $S_1$ (to be amplified) is applied to the delay lines in push-pull, as illustrated in FIG. 2, during some instant of time the magnitude of the signal $S_1$ will be such that a carrier wave signal $F'_1$ (dash line to the left of and therefore above $F_1$) will be several degrees out of phase with respect to a carrier wave $F'_2$ (dash line to the right of $F_2$) whereby the voltage difference A' between a center line $C'_1$ and the center line $C_2$ is substantially greater than the voltage difference A. Thus the current through the diode arrangement 40 changes as a function of the phase shift of the signals $F_1$ and $F_2$. Since the pair of lumped constant delay lines 12 and 13 is designed with each of these lines substantially identical to the other, the instantaneous phase variation is accomplished because of the application of the audio signal $S_1$ and therefore the output signal $S_0$, as filtered by the components 44, 45 and 46, is an amplification of the input signal $S_1$.

The slight mismatching of the delay lines 12 and 13 is arranged to prevent a voltage reversal across the diode arrangement 40 and thus prevent substantial distortion of the output signal $S_0$. On the other hand, a bridge circuit phase detector 20 (FIG. 1) may be used with the present invention whereby the complete matching of the unmodulated signals is feasible by tuning of the delay lines 12 and 13. However, the details of the more complex phase detectors are known in the art and, not being a part of the present invention, need not be discussed herein.

In one particular testing of the present invention, using four sets of lumped constant components in each of the two lumped constant delay lines 12 and 13, having an impedance of 200 ohms, a high frequency power signal $F_p$ of the order of 10 megacycles and an amplitude of 1 volt was utilized with the audio frequency signal $S_1$ having a frequency in the range of 50 to 2,000 cycles per second and an amplitude of one millivolt, from a source 15 having an impedance of 1,000 ohms. In accordance with the above described parameters the bias voltage was set at about 1.5 volts for several of the tests. The output signal $S_0$ using a diode arrangement consisting of four IN198 diodes in parallel was an exact copy of the input signal $S_1$ having voltage magnitude of 150 millivolts coupled to a load impedance (not illustrated) of 1,000 ohms.

The amount of amplification obtainable from the present invention is determined by the power available from the high frequency source, the number of lumped constant delay elements comprising the delay lines 12 and 13, the frequency $F_p$ of the power source relative to the delay line cutoff frequency, the internal impedance of the phase detector 20 relative to the impedance of delay lines 12 and 13, and the impedance matched design of the audio transformer 36. It is feasible to obtain linear amplification of very weak audio signals of the order of microvolts or less by the proper selection of parameters of the present invention. The signal frequency amplification response is limited largely by the characteristics of the transformer 36. Therefore, careful consideration should be given to the selection of the transformer 36 for the particular frequency of the signal $S_1$ to be amplified.

When it is inconvenient to provide a push-pull input signal $S_1$, a single ended system can be used as discussed above in connection with FIG. 1. It should be noted that the same total number of lumped constant delay line components in a single delay line (13) which is to be modulated allows the same gain as for the system illustrated in FIG. 2 using a pair of similar lumped constant delay lines. However, when using a single input arrangement, a fixed delay line must be added to the system.

While I have shown and described particular embodiments of the present invention, further modifications and improvements will occur to those skilled in the art. For instance, amplification can be obtained of signals $S_1$ having a frequency up to 100 or 200 megacycles with presently available circuit components. The bandwith of the present invention is largely determined by the coupling scheme used to obtain the high impedance input signal source (15). By careful design of the high impedance source arrangement, effective power gain may be obtained. Moreover, such careful design makes feasible a wide band, low noise amplifier competitive in gain and size with the well known distributed amplifier. Also, there are many possible applications of the present invention outside of the audio frequency field (discussed above) wherein a tuned impedance transformer will not restrict the circuit design. These applications will include various low noise pre-amplifiers useful in radio and television work and in industrial and scientific applications in the low RF frequency regions. I desire it understood, therefore, that this invention is not limited to the particular forms shown and I intend by the appended claims to cover all such modifications which do not depart from the true spirit and scope of my invention.

I claim:

1. A low noise audio amplifier system comprising: a pair of matched impedance delay lines, at least one of said pair comprising a plurality of voltage sensitive impedance elements; means for impressing a high frequency power signal on one end of each of said pair with the lines receiving in phase power signals; means for impressing a low frequency audio signal information on at least said one of said pair; and means coupled to the other end of said pair for detecting the relative phase shift of the power signal to provide a low noise amplified output of said signal information.

2. A low noise audio amplifier system comprising: a pair of similar lumped constant delay lines, comprising a plurality of voltage sensitive impedance elements; means for impressing a high frequency power signal on one end of each of said pair with the lines receiving in phase power signals; means for impressing in push-pull a low frequency audio signal information on said pair; and means coupled to the other end of said pair for detecting the relative phase shift of the power signal to provide a low noise amplified output of said signal information.

3. A low noise amplifier system comprising: a pair of similar lumped constant delay lines, each comprising a plurality of voltage sensitive impedance elements having one side thereof coupled to a similar element of the other delay line to form series voltage sensitive couplings between said pair; means for impressing a high frequency power signal on one end of each of said pair with the lines receiving in phase power signals; means for impressing a lower frequency audio signal information on said pair so that the signal information is coupled across said voltage sensitive couplings; and means coupled to the other end of said delay lines for detecting the relative phase shift of the power signal to provide a low noise amplified output of the signal information.

4. A low noise amplifier system comprising: a pair of similar lumped constant delay lines comprising a plurality of spaced voltage sensitive capacitors each having one side thereof coupled to a common ground; first coupling means for impressing a high frequency power signal on one end of each of said pair with said pair receiving in phase power signals; second coupling means for impressing a low frequency audio signal information on said pair so that signal information is coupled across said spaced voltage sensitive capacitors to vary their impedance to the power signal as a function of the relative magnitude of the signal information; and phase detector means coupled to the other end of said pair to receive the power signal traversing said pair for detecting the relative phase shift of the power signal to provide a low noise amplified output of the signal information.

5. A low noise amplifier system comprising: a pair of matched low impedance delay lines with at least one of said pair being a lumped constant delay line comprising a plurality of spaced voltage sensitive capacitors each having one side thereof coupled to a common ground; first coupling means for connecting a low impedance power source to said pair to impress a high frequency power signal on one end of each of said pair with both of said pair receiving in phase power signals; second coupling means for connecting a high impedance signal source to at least said one of said pair to impress a low frequency audio signal information on said lumped constant delay line so that signal information is coupled across said spaced voltage sensitive capacitors to vary their impedance to the power signal as a function of the relative magnitude of the signal information; and phase detector means coupled to the other end of said pair for detecting the relative phase shift of the power signal to provide a low noise amplified output of the signal information, said first coupling means including filter means arranged to prevent dissipation of the signal information in the power source, and other filter means arranged to prevent transmission of the signal information directly to said phase detector means.

6. A low noise audio amplifier system comprising: a pair of similar lumped constant delay lines comprising a plurality of voltage sensitive reverse bias semiconductor diodes each having a similar terminal thereof coupled to other components of said pair and other terminal coupled to a common ground; bias means coupled to both of said pair to prevent current flow through said diodes; first coupling means connected between the common ground and one end of each of said pair for impressing a high frequency power signal on said pair with each line receiving power signals of the same phase; second coupling means connected between the delay lines of said pair for impressing an audio frequency signal information on said one end of said pair so that the signal information is coupled to the similar terminals of said diodes; and phase detector means coupled to the other end of said delay lines for detecting the relative phase shift of the power signal to provide a low noise amplified output of the signal information.

7. A low noise parametric amplifier system comprising: a pair of similar lumped constant delay lines comprising a plurality of voltage sensitive reverse bias semiconductor diodes each having a similar terminal thereof coupled to other components of said pair and another terminal coupled to a common ground; bias means coupled to both of said pair to prevent current flow through said diodes whereby they will operate as voltage sensitive capacitors; first coupling means connected between the common ground and one end of each of said pair for impressing a high frequency power signal on said pair with each line receiving power signals of the same phase; second coupling means connected between the delay lines of said pair for impressing a low frequency audio signal information in push-pull to said pair so that signal information is coupled across the said diodes through said similar terminals; said first coupling means presenting a high impedance to the signal information; and phase detector means coupled to the other end of said delay lines for detecting the relative phase shift of the power signal to provide a low noise amplified output of the signal information.

8. A low noise parametric amplifier system comprising: a pair of similar lumped constant delay lines, each comprising a plurality of voltage sensitive impedance elements having one terminal coupled to a similar element of the other delay line to form a series voltage sensitive coupling therebetween; means for impressing a high frequency power signal on one end of each of said pair with said pair receiving in phase power signals; and means for impressing a low frequency audio signal information on each of said pair so that signal information is coupled across said voltage sensitive couplings to modify the transmission characteristics of each of said pair to said power signal and thereby develop a relative phase shift of said power signal as a function of the distance from said one end.

9. A low noise parametric amplifier system comprising: a pair of similar lumped constant delay lines, each comprising a plurality of voltage sensitive impedance elements having one terminal coupled to a similar element of the other delay line to form a series voltage sensitive coupling therebetween; coupling means for impressing a high frequency power signal on one end of each of said pair with said pair receiving in phase power signals; said coupling means being frequency sensitive to present a low impedance to said power signal; and means for impressing in push-pull a low frequency audio signal information on said pair so that signal information is coupled across said voltage sensitive couplings to modify the relative transmission characteristics of said pair to said power signal and thereby develop a relative phase shift of said power signal as a function of the distance from said one end.

10. A low noise parametric amplifier system comprising: a pair of matched impedance delay lines with at least one of said pair comprising a plurality of voltage sensitive impedance elements; means for impressing a high frequency power signal on one end of each of said pair with said pair receiving in phase power signals; and means for impressing a low frequency audio signal information on said one of said pair so that the instantaneous magnitude of the signal information changes the effective impedance of said one relative to the other of said pair to cause a relative phase shift of the power signal at the other end of said pair as a function of the length of said pair.

11. A low noise parametric amplifier system comprising: a pair of matched impedance delay lines with at least one of said pair comprising a plurality of voltage sensitive impedance elements; means for impressing a high frequency power signal from a low impedance power source on one end of each of said pair with said pair receiving in phase power signals; means for impressing a low frequency audio signal information from a high impedance source on said one of said pair so that the instantaneous magnitude of the signal information changes the effective impedance of said one relative to the other of said pair to cause a relative phase shift of the power signal at the other end of said pair as a function of the length of said pair; and means for isolating the low impedance power source from the high impedance signal source to prevent dissipation of the signal information power in the low impedance power source.

References Cited by the Examiner

UNITED STATES PATENTS

| | | | |
|---|---|---|---|
| 2,652,541 | 9/53 | Cutler | 333—14 |
| 2,923,882 | 2/60 | Bradford | 332—30 |
| 3,045,189 | 7/62 | Engelbrecht | 330—4 |

OTHER REFERENCES

Eckhardt et al.: "Digest of Technical Papers, 1960 International Solid-State Circuits Conference," February 1960, pages 34–35.

Jenkins: "Electrical Manufacturing," December 1954, pages 83–88.

Lombardo et al.: "AIL Internal Technical Memorandum No. 15" received in Patent Office March 25, 1959, 10 pages.

Salzberg et al.: "Proceedings of the IRE," June 1958, page 1303, Wittke, "RCA Review," December 1957, pages 441–457 (page 452 relied on).

ROY LAKE, *Primary Examiner.*

BENNETT G. MILLER, JOHN KOMINSKI, *Examiners.*